United States Patent
Tsukamoto et al.

(10) Patent No.: US 12,552,161 B2
(45) Date of Patent: Feb. 17, 2026

(54) RECORDING ELEMENT UNIT AND METHOD FOR MANUFACTURING RECORDING ELEMENT UNIT

(71) Applicant: CANON KABUSHIKI KAISHA, Tokyo (JP)

(72) Inventors: Naoya Tsukamoto, Kanagawa (JP); Hiroyuki Kigami, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 345 days.

(21) Appl. No.: 18/128,066

(22) Filed: Mar. 29, 2023

(65) Prior Publication Data
US 2023/0311498 A1    Oct. 5, 2023

(30) Foreign Application Priority Data
Mar. 30, 2022    (JP) .................. 2022-055555

(51) Int. Cl.
*B41J 2/14*    (2006.01)
*B41J 2/16*    (2006.01)
*H01L 23/00*    (2006.01)

(52) U.S. Cl.
CPC ......... *B41J 2/14072* (2013.01); *B41J 2/1601* (2013.01); *B41J 2/1623* (2013.01);
(Continued)

(58) Field of Classification Search
CPC .... B41J 2/14072; B41J 2/1601; B41J 2/1623; B41J 2002/14491; B41J 2202/11;
(Continued)

(56) References Cited

U.S. PATENT DOCUMENTS 9,662,885 B2 * 5/2017 Shimazu ............... B41J 2/1623
2003/0218245 A1 * 11/2003 Matsuzawa ............ H01L 24/05
257/734
(Continued)

FOREIGN PATENT DOCUMENTS

JP    H0684992 A    * 3/1994 ............ H01L 24/06
JP    07176558 A    * 7/1995 ............ H01L 24/48
(Continued)

OTHER PUBLICATIONS

English translation of JP-07176558-A foreign document (Year: 1995).*
(Continued)

*Primary Examiner* — Douglas X Rodriguez
*Assistant Examiner* — Natasha Dephenia Quinn
(74) *Attorney, Agent, or Firm* — Venable LLP

(57) ABSTRACT

A recording element unit includes a first electrode pad, a second electrode pad, and a wire for electrically connecting the first electrode pad and the second electrode pad. The wire has a plurality of bending points at which the wire is bent in the direction of extension of the wire between a first connection point and a second connection point. The plurality of bending points include a first bending point at a height from the first connection point of at least 100 μm and not more than 200 μm, a second bending point at a distance from the first bending point in the horizontal direction of at least 100 μm and not more than 270 μm, and a third bending point at a distance from the intermediate point between the first electrode pad and the second electrode pad in the horizontal direction of within 150 μm.

13 Claims, 7 Drawing Sheets

(52) U.S. Cl.
CPC .............. *H01L 24/48* (2013.01); *H01L 24/85* (2013.01); *H01L 2224/48096* (2013.01); *H01L 2224/48157* (2013.01); *H01L 2224/48465* (2013.01); *H01L 2224/85181* (2013.01); *H01L 2924/1426* (2013.01)

(58) Field of Classification Search
CPC ..................... H01L 24/48; H01L 24/85; H01L 2224/48096; H01L 2224/48157; H01L 2224/48465; H01L 2224/85181; H01L 2924/1426; H01L 24/745
See application file for complete search history.

(56) References Cited

U.S. PATENT DOCUMENTS

2005/0195247 A1* 9/2005 Yanagisawa ............ H01L 24/78
347/68
2017/0326876 A1* 11/2017 Otaka ........................ B41J 2/14

FOREIGN PATENT DOCUMENTS

| | | | | |
|---|---|---|---|---|
| JP | 2003-031605 A | | 1/2003 | |
| JP | 2014225565 A | * | 12/2014 | ............. H01L 24/97 |

OTHER PUBLICATIONS

English translation of JP-H0684992-A foreign document (Year: 1994).*

English machine translated version of Soji et al. (JP_2014225565_A) (Year: 2014).*

* cited by examiner

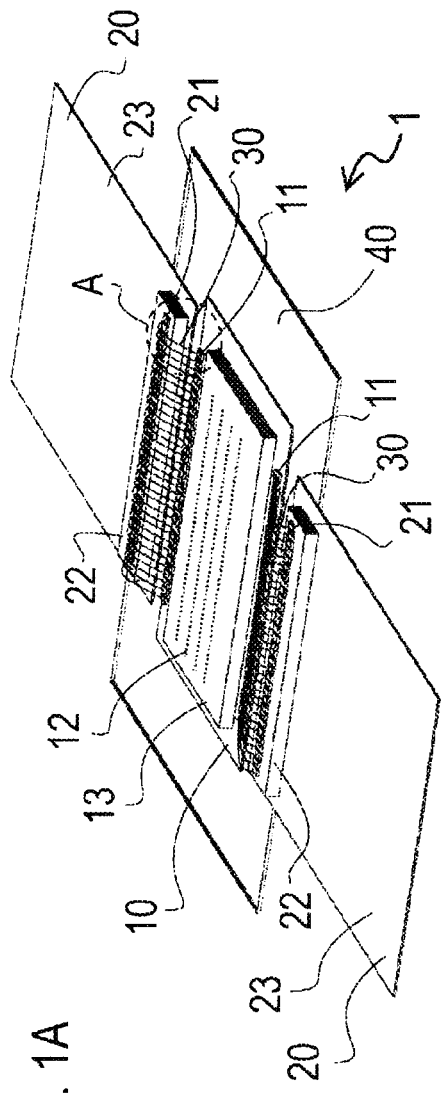
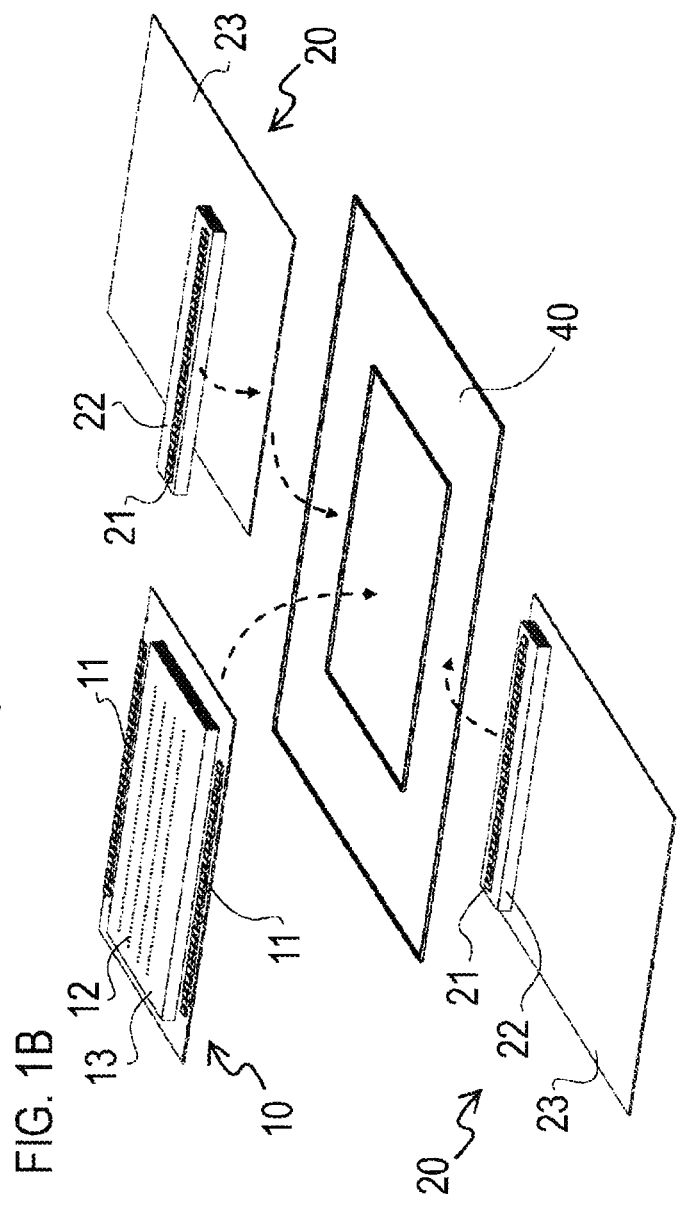
FIG. 1A
FIG. 1B

RECORDING ELEMENT UNIT AND METHOD FOR MANUFACTURING RECORDING ELEMENT UNIT

BACKGROUND OF THE INVENTION

Field of the Invention

The present invention relates to a recording element unit and a method for manufacturing a recording element unit.

Description of the Related Art

An ink jet printer is an output device for forming text or an image by ejecting microscopic ink droplets from an ink jet recording head, and has been used for a variety of uses such as household use, office use, or industrial use. The ink jet recording head is formed by bonding a recording element unit with a support member coupled with an ink supplying means with precision. The recording element unit is known to have a configuration including a recording element substrate having a silicon substrate including a plurality of ejection energy generating portions, an ink passage, and an ink ejection port formed therein, and a wiring substrate having an ejection signal output portion such as a driving IC, and for transmitting an electric signal from the printer main body to the recording element substrate.

Conventionally, as the electric mounting technology of electrically connecting a recording element substrate and a wiring substrate, wire bonding has been used. When a bonding wire comes in contact with the peripheral member or the adjacent bonding wire, resulting in a short-circuit, a problem such as poor insulation may be caused. For this reason, for wire bonding, it is important to form the shape of the bonding wire properly. Japanese Patent Application Publication No. 2003-31605 discloses the technology of forming a wire loop serving as the basic support, and keeping the desirable wire loop height in order to enhance the electric reliability of the device.

SUMMARY OF THE INVENTION

In recent years, for an ink jet recording head, downsizing a recording element substrate for manufacturing cost reduction, and miniaturization of components for higher performances have progressed. Thus, further densification has been demanded of the electric mounting means. However, for a small-sized device, due to limitations of the space to be provided with a support member, the method in which a support member such as a wire loop for supporting a wire as described above cannot be adopted. Further, the method in which the support member is provided also results in an increase in manufacturing cost.

The present invention was completed in view of the foregoing problem. It is an object of the present invention to provide a low-cost and highly-electrically-reliable recording element unit.

In order to attain the foregoing object, a recording element unit for use in a liquid ejection head of the present invention includes the following:
  a recording element substrate having an ejection energy generating portion, a flow passage, and an ejection port;
  an electric wiring member having a semiconductor integrated circuit for generating an electric signal for ejecting a liquid from the ejection port;
  a first electrode pad provided at either one of the recording element substrate and the electric wiring member, and a second electrode pad provided on the other; and
  a wire connected at one end thereof with the first electrode pad at a first connection point, and connected at the other end thereof with the second electrode pad at a second connection point, and electrically connecting the first electrode pad and the second electrode pad,
  wherein the wire includes a plurality of bending points at which a direction of extension of the wire is bent between the first connection point and the second connection point, the plurality of bending points include at least a first bending point, a second bending point, and a third bending point in order of proximity to the first connection point, and
  wherein a height $H1$, a distance $L2$, and a distance $W3$ satisfy the relational expressions (1) $100\ \mu m \leq H1 \leq 200\ \mu m$, (2) $100\ \mu m \leq L2 \leq 270\ \mu m$, and (3) $W3 \leq 150\ \mu m$,
  where $H1$ represents a height of the first bending point from the first connection point, $L2$ represents a distance from the first bending point to the second bending point in a horizontal direction, and $W3$ represents a distance from an intermediate point between the first electrode pad and the second electrode pad to the third bending point in the horizontal direction.

Further, in order to attain the foregoing object, a method for manufacturing a recording element unit for use in the liquid ejection head of the present invention, the recording element unit includes the following:
  a recording element substrate having an ejection energy generating portion, a flow passage, and an ejection port;
  an electric wiring member having a semiconductor integrated circuit for generating an electric signal for ejecting a liquid from the ejection port;
  a first electrode pad provided at either one of the recording element substrate and the electric wiring member, and a second electrode pad provided on the other; and
  a wire having a plurality of bending points, and connected at one end thereof with a first connection point of the first electrode pad, and connected at the other end thereof with a second connection point of the second electrode pad, and for electrically connecting the first electrode pad and the second electrode pad, and
  wherein the wire includes, in order of proximity to the first connection point in a direction of extension of the wire, a first bending point at a height from the first connection point of at least 100 μm and not more than 200 μm, a second bending point at a horizontal distance from the first bending point of at least 100 μm and not more than 270 μm, and a third bending point provided at a lower position than that of the first bending point, and at a distance of within 150 μm from an intermediate point between the first electrode pad and the second electrode pad in a horizontal direction, the method for manufacturing a recording element unit comprising the steps of:
  connecting one end of the wire to the first connection point;
  sequentially forming the first bending point, the second bending point, and the third bending point of the wire by a capillary operation; and
  connecting the other end of the wire to the second connection point.

Up to this point, in accordance with the present invention, it is possible to provide a low-cost and electrically reliable recording element unit.

Further features of the present invention will become apparent from the following description of exemplary embodiments with reference to the attached drawings.

BRIEF DESCRIPTION OF THE DRAWINGS

FIGS. 1A and 1B are each a perspective view of a recording element unit in accordance with Example 1;

DESCRIPTION OF THE EMBODIMENTS

Figure 2A:
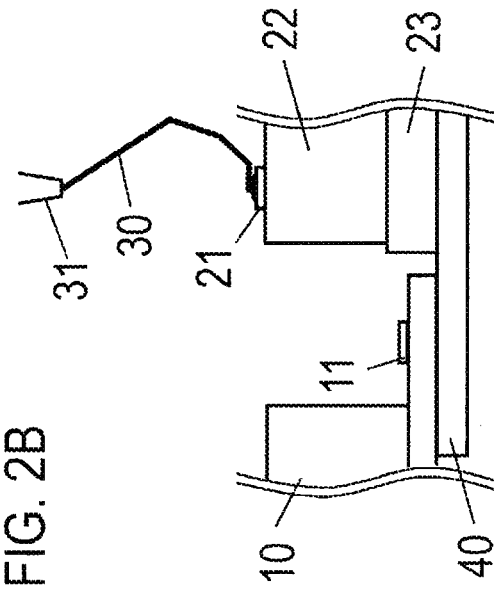
FIGS. 2A to 2D are each a schematic cross sectional view showing a wire bonding method in accordance with Comparative Example.

Hereinafter, a description will be given, with reference to the drawings, of embodiments (examples) of the present invention. However, the sizes, materials, shapes, their relative arrangements, or the like of constituents described in the embodiments may be appropriately changed according to the configurations, various conditions, or the like of apparatuses to which the invention is applied. Therefore, the sizes, materials, shapes, their relative arrangements, or the like of the constituents described in the embodiments are not intended to limit the scope of the invention to the following embodiments.

The present invention relates to a recording element unit to be provided in a liquid ejection head for ejecting a liquid to a to-be-recorded medium, and performing recording, and the like. The present invention is desirably applicable to, for example, the recording element unit of the ink jet head to be provided in an ink jet printer of an ink jet recording system for performing recording by foaming a liquid such as an ink by a heat energy. However, the recording element unit of the present invention is not limited thereto, and is applicable to the recording element units of various liquid ejection heads for ejecting a liquid using a heat energy.

Example 1

Schematic Configuration of Recording Element Unit

The configuration of a recording element unit 1 in accordance with Example 1 will be described with reference to FIGS. 1A and 1B. FIG. 1A is a perspective view of a recording element unit 1 in accordance with Example 1. FIG. 1B is an exploded perspective view of the recording element unit 1.

The recording element unit 1 of the present Example includes a recording element substrate 10 for ejecting an ink, an electric wiring member 20 to be connected with the recording element substrate 10 and the printer main body, and an ejection port surface cover 40 to be bonded to the ink ejection port (not shown) side of the recording element substrate 10. In the present Example, electric wiring members 20 are arranged and provided at both sides of the recording element substrate 10, respectively, and the recording element substrate 10 and the electric wiring members 20 are mounted on the ejection port surface cover 40. The recording element unit 1 is connected with a container for accommodating an ink. The ink supplied from the ink supplying means is ejected from the ink ejection port (not shown) of the recording element unit 1. As a result, the ink jet recording head performs ejection of the ink. Incidentally, in the following description, with the direction in which the recording element substrate 10 and the electric wiring members 20 are mounted on the ejection port surface cover 40 referred to as the height direction, and with the alignment direction of the recording element substrate 10 and the electric wiring members 20, and the direction in parallel with the mounting surface of the ejection port surface cover 40 referred to as the horizontal direction, a description will be given. This prescribes the height and the horizontality assuming the manufacturing process, and are terms strictly used for convenience. Namely, it is needless to say that this is a different standard from that of the direction in which the liquid ejection head and the recording element head are actually used.

The recording element substrate 10 has a plurality of electrode pads (hereinafter, PADs) 11 as connection terminals, an ejection energy generating portion (not shown) to which the PADs 11 have been electrically connected, a plurality of ink ejection ports, and an ink passage 12 in communication with the ink ejection port. The ink ejection port and the ink passage 12 are provided so as to form a plurality of arrays on a passage forming member 13. Further, the PADs 11 are also arrayed and provided in the same direction as that of the ink passage 12, and the PAD arrays are formed adjacent to the passage forming member 13. In the present Example, the PAD arrays are formed one array on each side of the passage forming member 13 on the side thereof to be provided with the electric wiring member 20.

The recording element substrate 10 is manufactured by a silicon processing technology. For the recording element substrate 10, a wafer including the ejection energy generating portion and the electrode PADs 11 formed thereon, and a wafer including the ink ejection ports and the ink passage 12 formed thereon are joined with each other, which is singulated by dicing.

The electric wiring member 20 has a plurality of PADs 21 as connection terminals, a driving IC (semiconductor integrated circuit) 22 provided with the PADs 21, and for generating and outputting an electric signal of ink ejection, and a heat-insulating member 23 for supporting the driving IC 22. In order to prevent the heat when the driving IC 22 has generated heat from being transmitted to the recording element substrate 10 and an ink, the driving IC 22 is provided on the heat-insulating member 23.

On the driving IC 22 electrically mounted on the electric wiring member 20 to be connected with the printer main body, a plurality of PADs 21 corresponding to the plurality of PADs 11 are arrayed, so that PAD arrays arrayed in the same direction as that of and at the same interval as that of the PAD array of the PADs 11 are formed. In the present Example, for the electric wiring member 20, a flexible wiring substrate using polyimide for the base film and the cover film is used. Incidentally, the electric wiring member is not limited to the foregoing configuration, and can be appropriately selected from those including a print wiring substrate, or the like.

In the present Example, the PAD 21 is provided at a higher position relative to that of the PAD 11, and a bonding wire (hereinafter, a wire) 30 formed by wire bonding establishes an electric connection between the PADs 11 and the PADs 21. As described above, the PADs 11 and the PADs 21 form respective PAD arrays, and one PAD 21 is connected to a corresponding one PAD 11. Namely, in the recording element unit 1, a plurality of wires 30 for connecting the PADs 11 and the PADs 21 are provided adjacent to one another in the array direction of the PAD arrays. When the adjacent wires 30 come in contact with each other, resulting in a short circuit, poor insulation or the like is caused. For this reason, the wires 30 are provided at a given interval as with the PADs 11 and the PADs 21. The wire 30 of the present Example uses a gold wire with a diameter of 18 μm. Incidentally, the wire diameter and the material of the wire are not limited thereto, and can be appropriately changed in consideration of the strength, the positional relationship among respective members, and the like.

The recording element substrate 10 and the driving IC 22 are electrically connected with each other by connecting the PADs 11 and the PADs 21 with the wires 30. After formation of the wires 30 with wire bonding, the electrically connected PADs 11 and 21 and the wires 30 are covered and protected with a sealing material (not shown), resulting in the formation of the recording element unit 1.

An ejection port surface cover 40 is a sheet-shaped member connected with the recording element substrate 10 and the electric wiring members 20. The ejection port surface cover 40 is bonded to the surface of the recording element substrate 10 provided with ink ejection ports, and is opened to match the ink ejection ports. Namely, the position of the electric wiring member 20 with respect to the recording element substrate 10 is fixed by the ejection port surface cover 40. In the present Example, as the material for the ejection port surface cover 40, alumina is used. Incidentally, the material and the shape of the cover are not limited thereto, and can also be appropriately changed to other metal members, or the like.

Wire Bonding

Prior to the description of the shape of the wire 30 and the advantageous effects thereof in accordance with the present Example, the wire bonding method will be described using Comparative Example. Comparative Example has the same configuration as that of Example 1, except for the forming method and the shape of the wire 30. For this reason, for the description of Comparative Example, the same members as those of Example 1 will be given the same reference numerals and signs, and will not be described.

Figure 2B:
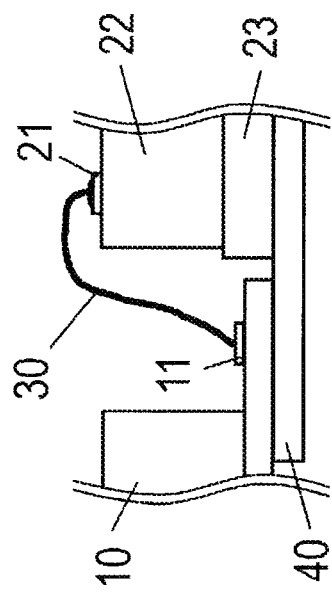
Figure 2C:
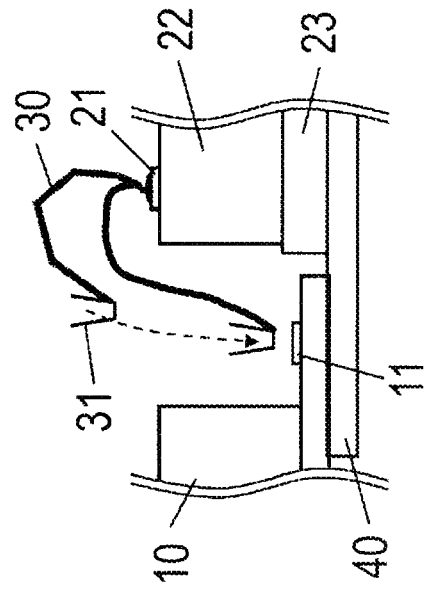
Figure 2D:
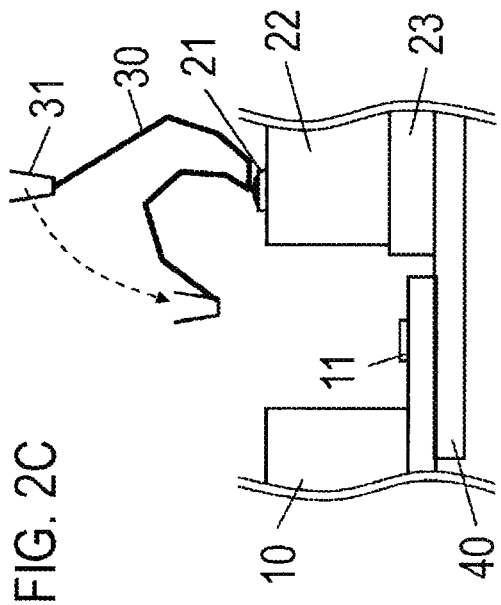

FIGS. 2A to 2D are each a schematic front view showing a wire bonding method in accordance with Comparative Example. Wire bonding includes a step of connecting one end of the wire to one PAD, a step of imparting the bending tendency to the wire, and a step of connecting the other end of the wire to the other PAD. FIG. 2A shows the state in which the PAD 11 and the PAD 21 are connected by the wire 30 upon completion of wire bonding. FIG. 2B shows the state after connecting one end of the wire 30 to the PAD 21, and imparting the bending tendency to the wire 30 by a capillary 31. FIG. 2C shows the state in which the capillary 31 is brought down toward the PAD 11. FIG. 2D shows the state immediately before connection of the wire 30 to the PAD 11.

As shown in FIG. 2A, the PAD 21 and the driving IC 22 are provided on the heat-insulating member 23, and a step is created between the PAD 21 and the PAD 11. With such a configuration, in order to avoid the wire 30 from coming into contact with a peripheral member such as the driving IC 22 and the adjacent wire 30, the wire 30 is formed in a loop shape. The loop shape is formed by imparting the bending tendency to the wire 30 due to the movement of the capillary 31. Below, the method for forming the wire 30 by the capillary 31 in accordance with a Comparative Example will be described in detail.

In the formation of the wire 30, first, a ball bond serving as one end of the wire 30 is formed at the PAD 21 as a first electrode pad situated on the upper stage side. Then, the capillary 31 imparts the bending tendency to the wire 30 while moving, so that a loop shape is formed. FIG. 2B shows the wire 30 formed in a loop shape with one end connected to the PAD 21, and with the other end connected to the wire 30.

Then, in order to connect the other end side of the wire 30 formed in a loop shape to the PAD 11 as a second electrode pad situated on the lower step side, as shown in FIG. 2C, the capillary 31 moves in such a manner as to be brought down toward the PAD 11. Then, as shown in FIG. 2D, the capillary 31 further comes closer to the PAD 11, and a second bond is formed at the PAD 11. As a result, the PAD 11 and the PAD 21 are electrically connected with each other by the wire 30. In the bring-down step of the capillary 31 shown in FIGS. 2C and 2D, the posture of the wire 30 is changed. At this step, the loop shape of the wire 30 can be changed due to its own weight of the wire 30 and the movement of the capillary 31. When the bending tendency imparted to the wire 30 is transformed, and the loop shape is lost, the wire 30 may be bent or tilted in an unintended direction, so that a short circuit between the wires 30 may be caused, or the wire 30 may come in contact with other members. However, how the loop shape is deformed varies according to the positional relationship between the PAD 11 and the PAD 21, and the like. For this reason, it is very difficult to precisely predict how much the loop shape is deformed. In order to avoid the contact between the wire 30 and other members, it can be considered that the gap between the wire 30 and other members or the gap between the adjacent wires 30 is previously set large so as to allow large deformation of the loop shape. This, however, is not preferable for miniaturization of the unit.

Electric Connection Configuration

Figure 3B:
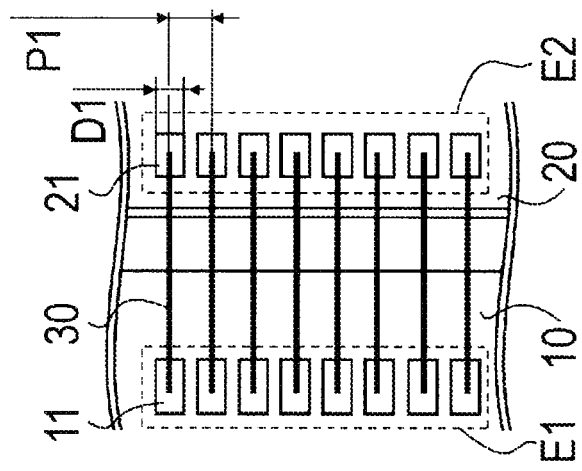
FIGS. 3A and 3B are each a view showing an electric connection configuration in accordance with Example 1.
Figure 3A:
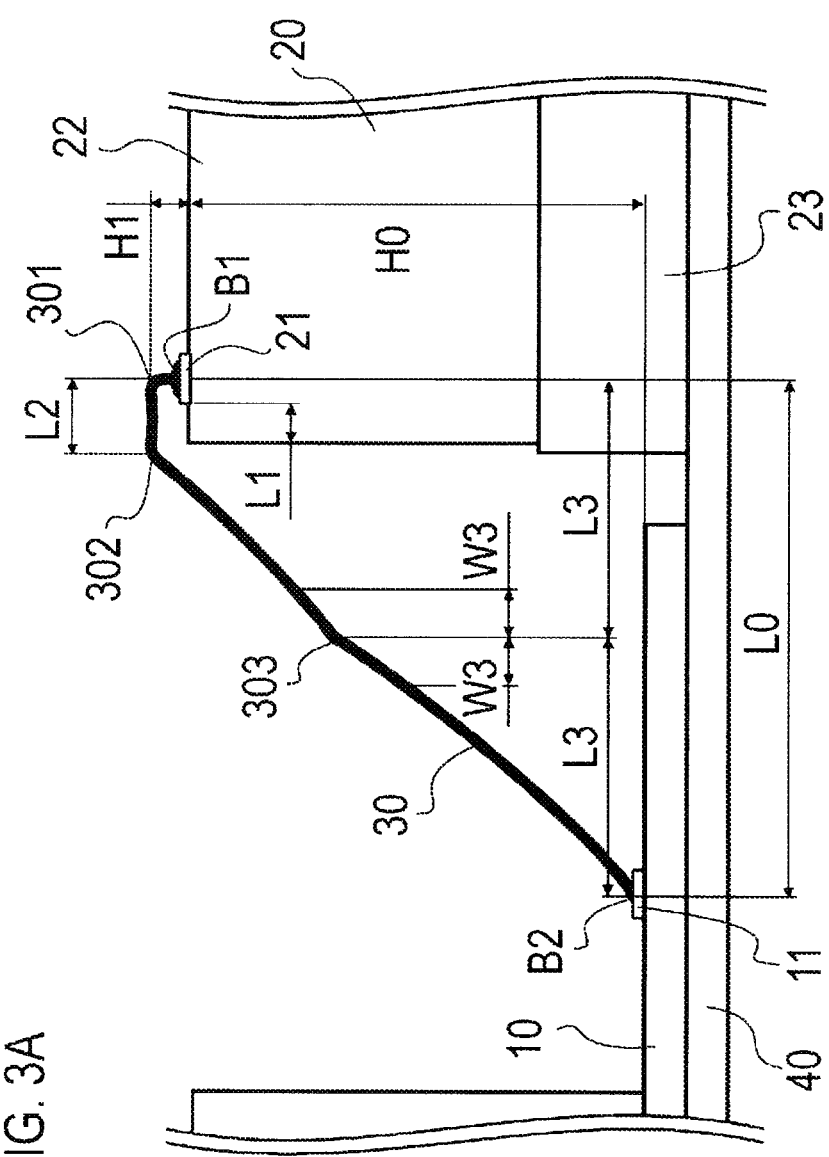

Then, referring to FIGS. 3A and 3B, a description will be given to the electric connection configuration of the recording element unit 1 by the wire 30 in accordance with the present Example. FIG. 3A is a detail front view showing the part A of FIG. 1A, and shows the loop shape of the wire 30 for connecting the recording element substrate 10 and the driving IC 22. FIG. 3B is a schematic front view of the recording element unit 1, and shows the mounted PAD array.

In the present Example, the first connection point B1 between the wire 30 and the PAD 21 is at a higher position than that of the second connection point B2 between the wire 30 and the PAD 11. The horizontal distance L0 between the first connection point B1 and the second connection point B2 is 1000 μm, and the difference in height H0 is 900 μm. In the horizontal direction orthogonal to the array direction of the PAD array, the distance L1 between the end of the driving IC 22 and the end of the PAD 21 is 100 μm. Considering the manufacturing errors, and the like so as to prevent the contact between the wire 30 and the driving IC 22, the PAD 21 is preferably positioned as close as possible to the end of the driving IC 22.

The wire 30 of the present Example is formed in a loop shape having three bending points. The present inventors conducted a close study thereon. As a result, they could find that the impartment of the bending tendency so that at least 3 bending points are formed at proper positions largely improves the deformation resistance of the wire 30 for connecting the PADs. Herein, the bending point is the base point of the bend portion imparted with the bending tendency by the capillary operation of wire bonding so that the wire 30 becomes steeper from the PAD 21 toward the PAD 11. The wire 30 has a first bending point 301, a second bending point 302, and a third bending point 303 in order of proximity to the PAD 21 at a higher position in the direction of extension of the wire 30.

The wire 30 first extends from the first connection point B1 to the first bending point 301 in the substantially vertical (height) direction. Then, the wire 30 extends so as to be closer to the second connection point B2 from the first bending point 301 to the second bending point 302 in the substantially horizontal direction. Further, the wire 30 extends tilted downward from the second bending point 302 to the second connection point B2 through the third bending point 303, and the angle with respect to the horizontal direction sharply changes at the third bending point 303.

The first bending point 301 is formed substantially right above the first connection point B1, and the height H1 of the first bending point 301 from the first connection point B1 is 120 µm. A lower height H1 of the first bending point 301 results in smaller deformation after impartment of the bending tendency decreases, and also contributes to the saving of the space of the recording element unit 1. However, when the height H1 of the first bending point 301 is too low, the wire 30 becomes more likely to come in contact with the edge of the driving IC 22, or the like. Thus, setting of the height H1 so as to satisfy the relational expression of 100 µm≤H1≤200 µm is particularly effective for the improvement of the deformation resistance and saving of the space of the wire 30.

The second bending point 302 is situated at substantially the same height as that of the first bending point 301, and closer to the second connection point B2 side than the first bending point 301 in the horizontal direction. The horizontal distance L2 between the second bending point 302 and the first bending point 301 is 150 µm. A larger horizontal distance L2 is more likely to prevent the contact of the wire 30 with the edge of the driving IC 22, or the like. However, when the horizontal distance L2 is too large, the deformation of the wire tends to increase. Thus, setting of the horizontal distance L2 so as to satisfy the relational expression of 100 µm≤L2≤270 µm is particularly effective for the improvement of the deformation resistance of the wire 30.

Provision of the first bending point 301 in the vicinity of the first connection point B1, and further the provision of the second bending point 302 in the vicinity of the first bending point 301 could reduce the amount of deformation of the wire 30 at the time of the bring-down step of the capillary 31. Particularly, proper formation of the bending point at the portion of the wire 30 at which the distance between the wire 30 and the driving IC 22 tends to decrease can suppress the deformation of the wire 30, which can prevent the contact of the wire 30 with other members.

The third bending point 303 is situated between the second bending point 302 and the second connection point B2. The wire 30 extends downward from the second bending point 302 toward the second connection point B2, and the third bending point 303 is situated below the first bending point 301 and the second bending point 302. In the horizontal direction, the third bending point 303 is situated at the intermediate point between the first connection point B1 and the second connection point B2. The horizontal distance L3 between the third bending point 303 and the first connection point B1 or the second connection point B2 is 500 µm. For example, when the third bending point 303 is at the position extremely closer to the second connection point B2 than to the first connection point B1, the distance between the third bending point 303 and the first connection point B1 increases, resulting in an increase in deformation amount of the wire 30. Conversely, when the third bending point 303 is at the position extremely closer to the first connection point B1 than to the second connection point B2, the distance between the third bending point 303 and the second connection point B2 increases, resulting in an increase in deformation amount of the wire 30. Thus, the third bending point 303 is desirably provided in the vicinity of the intermediate point between the first connection point B1 and the second connection point B2. Setting of the horizontal distance W3 from the intermediate point between the first connection point B1 and the second connection point B2 to the third bending point 303 so as to satisfy the relational expression of W3≤150 µm is particularly effective for the improvement of the deformation resistance of the wire 30.

Provision of the third bending point 303 in the vicinity of the intermediate point in the horizontal direction between the PAD 11 and the PAD 21 can particularly suppress the deformation of the wire 30 from the second connection point B2 to the second bending point 302. Suppression of the deformation of the wire 30 at the portion is effective for preventing the contact between the adjacent wires 30.

As described above, by providing the wire with the plurality of bending points, it is possible to suppress the deformation of the portion except for the bending points of the wire even when the wire is bent at the time of bringing down the capillary. Accordingly, the bending tendency of the wire will not be disturbed. Namely, even when there is a difference in height between the PADs, it is possible to form a wire in a loop shape close to the deign value without providing a jig, or the like.

Incidentally, when the difference in height H0 is extremely larger relative to the horizontal distance L0, the wire bending during bringing down of the capillary becomes too large. Accordingly, the disturbance of the bending tendency and the wire deformation at points except for the bending point become remarkable. On the other hand, when the PAD 11 and the PAD 21 are configured so as to satisfy the relational expression of 0≤H0/L0≤1.3 for the horizontal distance L0 and the difference in height H0, such arrangement of the bending points as to satisfy the respective relational expressions is effective for suppressing the deformation of the wire. Herein, H0/L0=0 means that there is no difference in height between the first connection point B1 and the second connection point B2, and that respective connection points are situated at the same height.

Further, the horizontal distance L0 between the first connection point B1 and the second connection point B2 falls within the range of 900 µm≤L0≤1500 µm, and the difference in height H0 falls within the range of 200 µm≤H0≤1100 µm. This is effective for suppressing the deformation of the wire. This is due to the following: in the case where the horizontal distance L0 and the difference in height H0 are too large, the distance between the first connection point B1 and the second connection point B2 is large; even when the bend point is provided, the deformation of the wire may not be able to be fully suppressed.

As described previously, the PADs 11 and the PADs 21 are arrayed at regular intervals, respectively. A PAD array E1 as a first pad array and a PAD array E2 as a second pad array are formed. As shown in FIG. 3B, the width D1 in the array direction of the PADs 11 is 57 µm, and the array pitch P1 of the PADs 11 of the PAD array E1 is 75 µm. Further, the width in the array direction of the PADs 21 is the same as that of the width PAD 11, and the array pitch of the PAD array E2 is the same as that of the PAD array E1. Namely, the wires 30 for connecting the PADs 11 and the PADs 21 are also arranged in the array direction at regular intervals, and the adjacent pitch of the wires 30 adjacent continuously in the array direction is 75 µm.

A plurality of bending points are formed at the wire, and the deformation resistance is improved in order to avoid the short circuits between the adjacent wires as in the present Example. This is effective particularly when the adjacent pitch of the wires is small. More specifically, this is effective when the pitch in the array direction of PADs is 80 µm or less, or w % ben the adjacent pitch of the wires is 80 µm or less. Further, this is effective when the PADs or the wires are arranged in a high density using narrow-width PADs with a width in the array direction of 60 µm or less.

Figure 4:
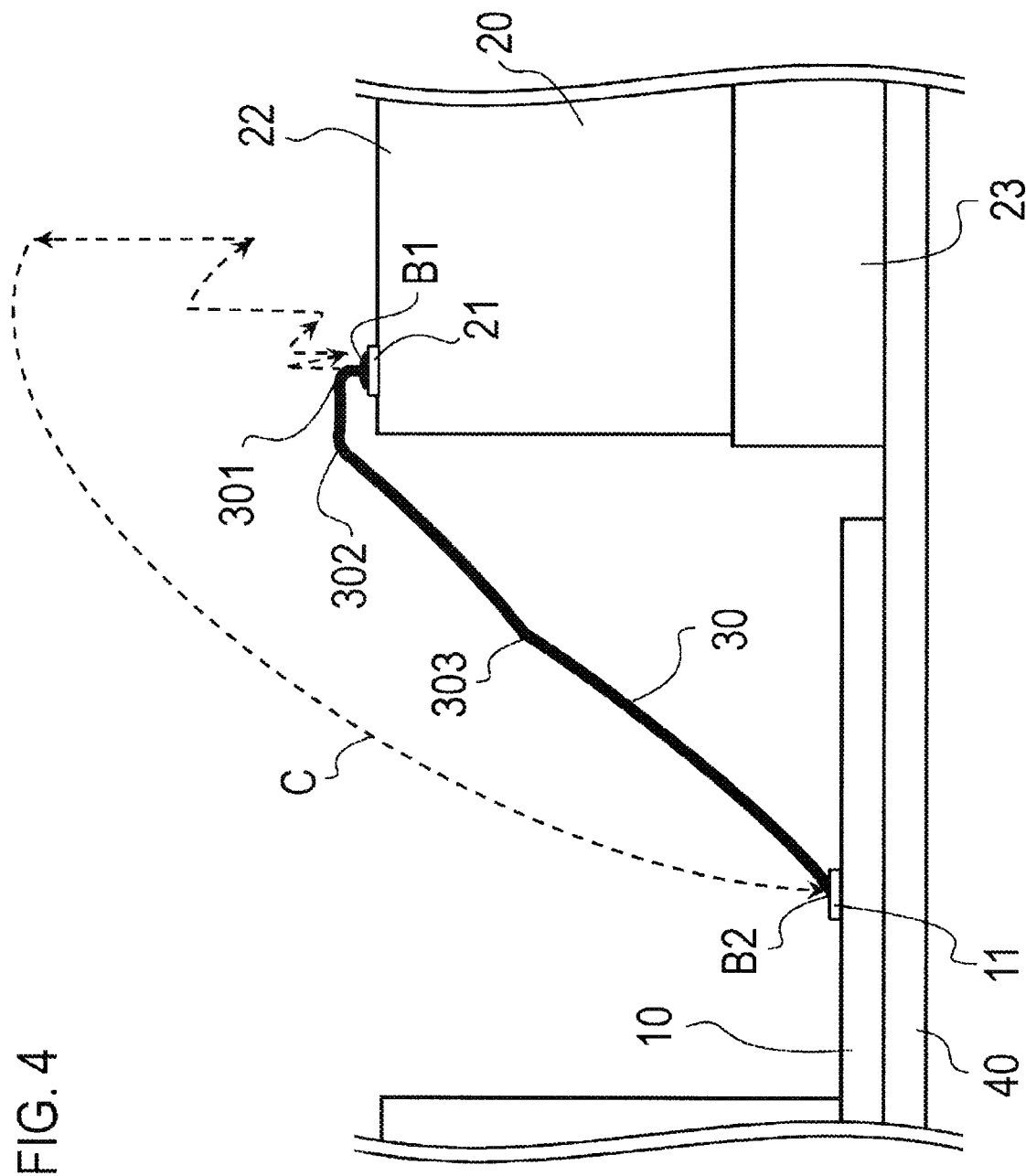
FIG. 4 is a view showing the capillary operation of wire bonding in accordance with Example 1.

FIG. 4 is a view showing the operation of the capillary 31 in wire bonding for forming the wire 30 of the present Example. In FIG. 4, the locus C of the movement of the capillary 31 is indicated with a dotted line. In wire bonding, first, a step of connecting one end of the wire 30 onto the PAD 21, and forming a ball bond is performed. Subsequently, a step of allowing the capillary 31 to operate so as to impart the wire 30 with the bending tendency is performed. When the bending tendency is imparted, the capillary 31 moves toward the side away from the PAD 11 downward and in the horizontal direction. In the bending tendency imparting step of the present Example, such a capillary operation is performed three times, so that the first bending point 301, the second bending point 302, and the third bending point 303 are sequentially formed. After the bending tendency imparting step thereof is performed, the bringing down of the capillary 31 by which the capillary 31 moves to the PAD 11 is performed, and the step of connecting the other end of the wire 30 to the PAD 11 is performed.

From the description up to this point, in accordance with the present Example, also for a small-sized recording element unit for which it is difficult to provide the support member of the wire, the deformation resistance of the wire can be improved, which can suppress the unintended deformation of the wire. As a result, even when the wires are arranged in a high density, it is possible to prevent the contact between the wires and the contact between the wire and other members. Accordingly, it is possible to provide a recording element unit with a high electric reliability. Further, it is also unnecessary to provide the support member for regulating the deformation of the wire, and the like. This leads to the reduction of the manufacturing cost.

Incidentally, the layout relationship among respective members, the position of the bending points, the manufacturing method, and the like are not necessarily limited to the foregoing Examples, and can be appropriately changed. For example, even when the difference in height between the PADs is small, or even when there is no difference in height, formation of the first and second bending points in the vicinity of the ball bond at the wire can form the loop shape as intended without disturbing the impartment of the tendency to the wire. Further, by changing the position of the second bending point according to the distance between the end of the driving IC and the electrode PAD, it is possible to avoid the edge touch of the bonding wire. Further, an increase in wire diameter can suppress the deformation of the wire caused during bringing down of the capillary. A decrease in wire diameter enables an increase in permissible amount of wire bending after bonding. Furthermore, it may also be configured such that a different bending point from the third bending point is further provided between the second bending point and the second connection point.

Example 2

Then, Example 2 in accordance with the present invention will be described. Example 2 is different from Example 1 in the array configuration of the PADs 11 and the PADs 21. Of the configuration of Example 2, the same configuration as that of Example 1 will be given the same reference numeral and sign, and will not be described. Below, the characteristic configuration of Example 2 of the present invention will be described by reference to FIGS. 5A and 5B.

In Example 1, in the PAD array E1 on the recording element substrate 10, the PADs 11 were arrayed in one array. Meanwhile, in the PAD arrays E3 of the present Example, it is configured such that the PADs 11 are arrayed in two arrays. In the present Example, the PADs 11 are provided in a staggered array so as to be alternate in the array direction. Further, the PAD array E4 on the electric wiring member is configured such that the PADs 21 are arrayed in two arrays so as to be alternate in the array direction, and the PADs 21 are provided in a staggered array. Below, for description of the PADs 11, the one closer to the PAD 21 is referred to as a PAD 11a, and the other distant from the PAD 21 is referred to as a PAD 11b, thus giving a description by affixing a or b to the end of the reference numeral, if required, for distinction. Further, for description of the PAD 21, the one closer to the PAD 11 is referred to as a PAD 21a, and the other distant from the PAD 11 is referred to as a PAD 21b, thus giving a description by affixing a or b to the end of the reference numeral, if required, for distinction. The PAD 11a is electrically connected with the PAD 21a by a wire 30a, and the PAD 11b is electrically connected with the PAD 21b by a wire 30b.

Figure 5B:
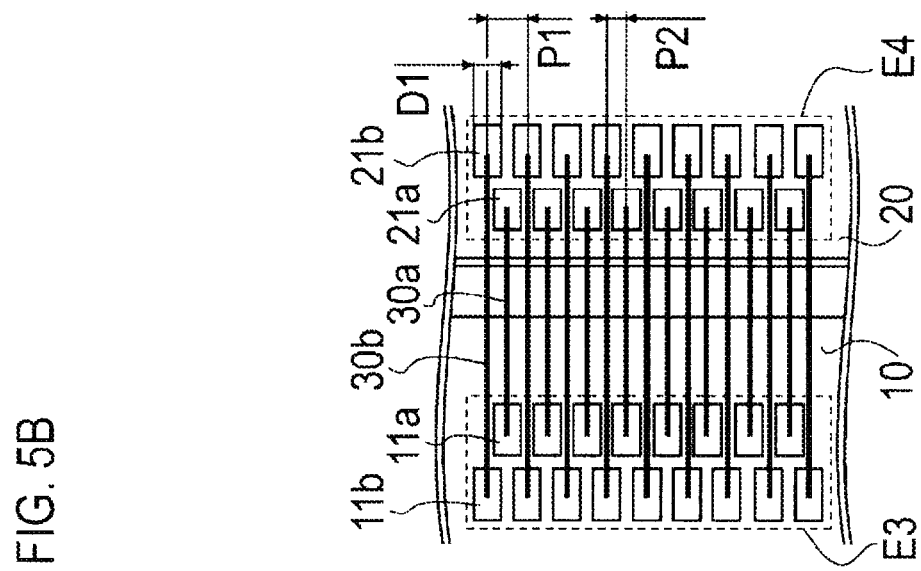
FIGS. 5A and 5B are each a view showing an electric connection configuration by a wire in accordance with Example 2.
Figure 5A:
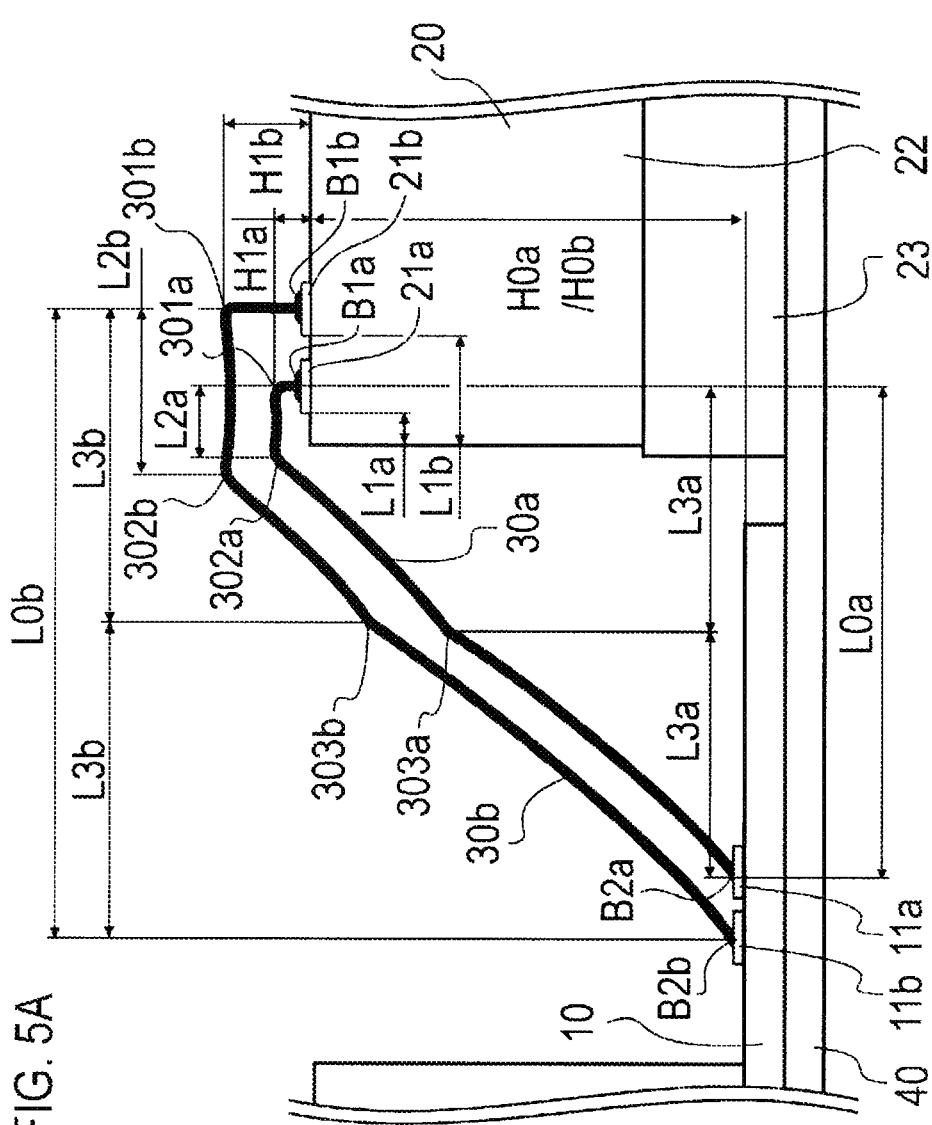

FIG. 5A is a detailed front view of a recording element unit in accordance with the present Example, and shows the loop shape of the wire 30 for connecting the recording element substrate 10 and the driving IC 22. FIG. 5B is a detailed top view of the recording element unit of the present Example, and shows a mounted PAD array.

The positional relationship between the PAD 11a and the PAD 21a, and the positional relationship of the wire 30a are the same as those of Example 1. Namely, the horizontal distance L0a between the first connection point B1a of the wire 30a and the PAD 21a, and the second connection point B2a of the wire 30a and the PAD 11a is 1000 µm, and the vertical distance (difference in height) H0a is 900 µm. Further, the distance L1a from the end of the driving IC 22 to the end of the PAD 21a in the horizontal direction orthogonal to the array direction of the PAD array is 100 µm.

The wire 30a of the present Example has a first bending point 301a, a second bending point 302a, and a third bending point 303a. The first bending point 301a is formed substantially right above the first connection point B1a, and the height H1a of the first bending point 301a from the first connection point B1a is 120 µm. The second bending point 302a is situated at substantially the same height as that of the first bending point 301a. The horizontal distance L2a between the second bending point 302a and the first bending point 301a is 150 µm. In the horizontal direction, the third bending point 303a is situated at the intermediate point between the first connection point B1a and the second connection point B2a. The horizontal distance L3a between the third bending point 303a and the first connection point B1a or the second connection point B2a is 500 µm.

Then, a description will be given to the electric connection configuration by the wire 30b for connecting the PAD 11b and the PAD 21b. The horizontal distance L0b between the first connection point B1b and the second connection point B2*b* is 1250 µm, and the vertical distance (difference in height) H0*b* is 900 µm. In the horizontal direction orthogonal to the array direction of the PAD array, the distance L1*b* from the end of the driving IC 22 to the end of the PAD 21*b* is 225 µm.

The wire 30*b* is also formed in a loop shape having the same three bending points as those of the wire 30*a*. The wire 30*b* has a first bending point 301*b*, a second bending point 302*b*, and a third bending point 303*b*. The first bending point 301*b* is formed substantially right above the first connection point B1*b*. The height H1*b* of the first bending point 301*b* from the first connection point B1*b* is 180 µm. Namely, the height H1*b* falls within the range of at least 100 µm and not more than 200 µm, and satisfies the relational expression shown in Example 1. The second bending point 302*b* is situated at substantially the same height as that of the first bending point 301*b*. The horizontal distance L2*b* between the second bending point 302*b* and the first bending point 301*b* is 270 µm. Namely, the horizontal distance L2*b* is at least 100 µm and not more than 270 µm, and satisfies the relational expression shown in Example 1. In the horizontal direction, the third bending point 303*b* is situated at the intermediate point between the first connection point B1*b* and the second connection point B2*b*. The horizontal distance L3*b* between the third bending point 303*b* and the first connection point B1*b* or the second connection point B2*b* is 625 µm. Namely, in the horizontal direction, the third bending point 303*b* is at a distance of within 150 µm from the intermediate point with the first connection point B1*b* or the second connection point B2*b*. By forming the bend portion at the position, it is possible to improve the deformation resistance of the wire 30*b* as with the wire 30*a*.

The wire 30*a* and the wire 30*b* are formed so that the plurality of bending points are situated at their respective proper positions, respectively. This can suppress the deformation at the time of bringing down of the capillary, so that the wire 30*a* and wire 30*b* adjacent to each other are less likely to come in contact with each other. Further, the wire 30*b* is provided so as to be situated above the wire 30*a* as seen from the direction orthogonal to the array direction. Namely, it is configured as follows: even when the wire 30*a* and the wire 30*b* adjacent to each other in the array direction are shifted in the adjacent direction, contact therebetween is less likely to be caused.

As described previously, the PADs 11*a* and the PADs 11*b* are arrayed alternately at regular intervals, resulting in the formation of a PAD array E3 in a two-array staggered array. Further, the PADs 21*a* and the PADs 21*b* are also similarly arrayed alternately at regular intervals, resulting in the formation of a PAD array E4 in a two-array staggered array. As shown in FIG. 5B, the width D1 in the array direction of the PAD 11*a* or the PAD 11*b* is 57 µm. When the PAD 11*a* is seen as a single unit, the array pitch P1 of the PAD 11*a* is 75 µm. On the other hand, the array pitch P2 of the PAD arrays E3 of the interval between the PAD 11*a* and the PAD 11*b* is half the array pitch P1, or 37.5 µm. By thus providing two kinds of wires in different loop shapes, it is possible to set the PAD array in a staggered array, and to establish an electric connection in a higher density. As a result, the component can be more miniaturized.

Example 3

Figure 6A:
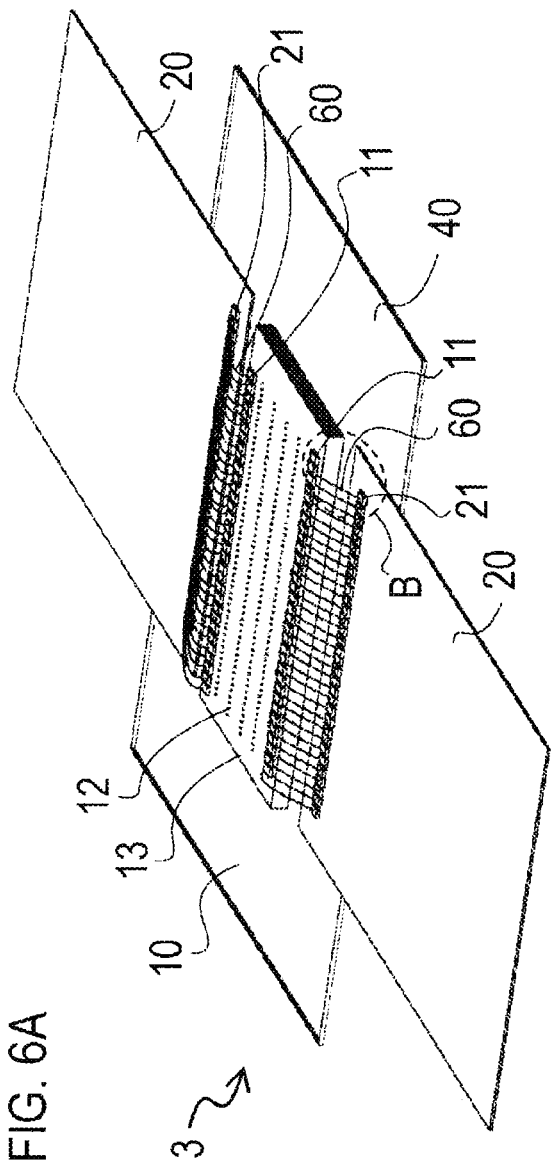
FIGS. 6A and 6B are each a view of a recording element unit in accordance with Example 3.
Figure 6B:
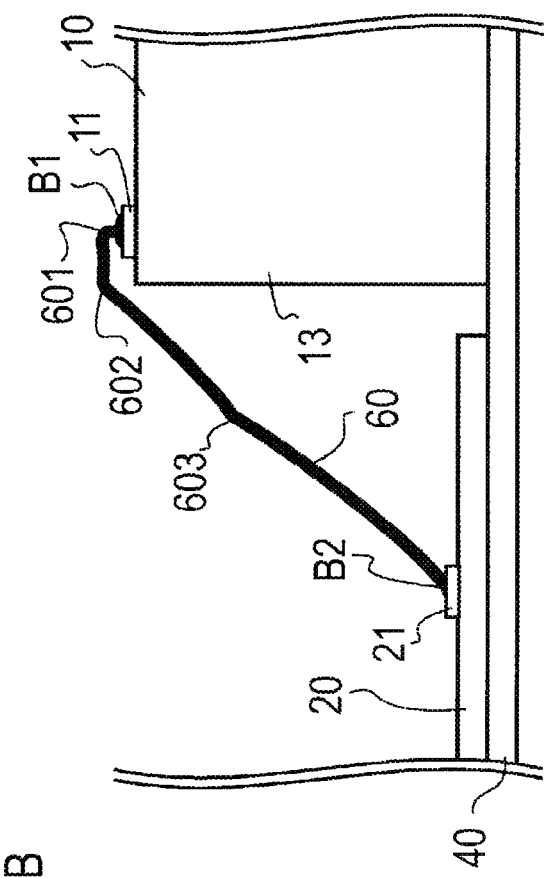

Then, Example 3 in accordance with the present invention will be described. Example 3 is different from Example 1 in that the PAD 11 is provided at a higher position than that of the PAD 21. Of the configuration of Example 3, the same configuration as that of Example 1 will be given the same reference numeral and sign, and will not be described. Below, the characteristic configuration of Example 3 of the present invention will be described by reference to FIGS. 6A and 6B. FIG. 6A is a perspective view of a recording element unit 3 in accordance with the present Example. FIG. 6B is a detailed front view showing the part B of FIG. 6A.

In the present Example, an electric wiring member 20 is electrically connected with the recording element substrate 10, and the PAD 11 on the recording element substrate 10 is at a higher position relative to the PAD 21 on the electric wiring member 20. Namely, when a wire 60 is formed, first, one end is connected with the PAD 11 as a first electrode pad. Then, a bending point is formed by the capillary operation, and the other end is connected to the PAD 21 as a second electrode pad. Incidentally, the driving IC is mounted in the electric wire to be connected from the electric wiring member to the printer main body.

The wire 60 of the present Example has a first bending point 601, a second bending point 602, and a third bending point 603 sequentially in order of proximity to the PAD 11 at a higher position. In the present Example, a first connection point B1 is formed on the PAD 11, and a second connection point B2 is formed on the PAD 21. Even when the PAD 11 on the recording element substrate 10 is thus at a higher position than that of the PAD 21 on the electric wiring member 20, by providing a plurality of bending points at their respective proper positions, it is possible to suppress the deformation of the wire 60. Particularly, by determining the positions of respective connection points and respective bending points so as to satisfy each relational expression shown in the description of Example 1, it is possible to further improve the deformation suppressing effect of the wire.

Figure 7:
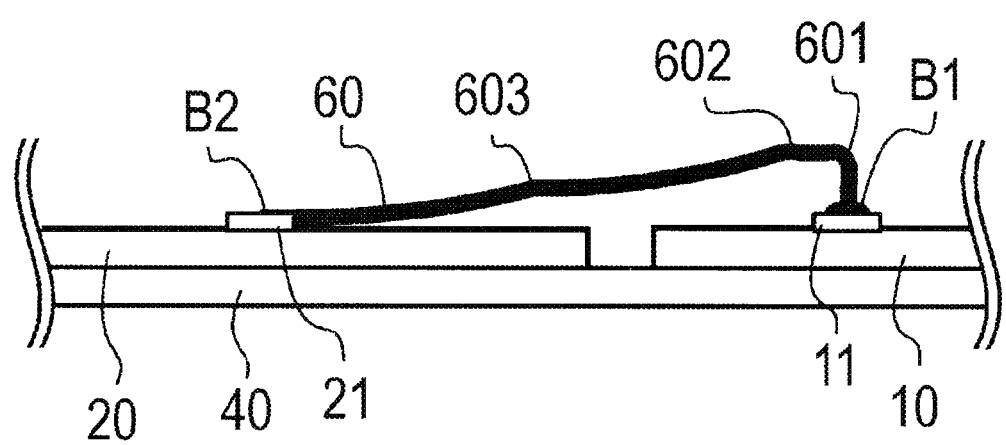
FIG. 7 is a view showing an electric connection configuration by a wire in accordance with Modified Example.

From the description up to this point, in accordance with the present Example, the same effects as those of Example 1 can be obtained. Additionally, a stitch bond is not formed at the electrode pad on the silicon substrate. This enables wire bonding to be performed without causing breakage of the electrode pad formed on the silicon substrate, and the electric wires. The present invention is applicable to either of the case where the electrode pad on the recording element unit is at a higher position or the case where the electrode pad on the driving IC (on the semiconductor integrated circuit) is at a higher position. Alternatively, the present invention is also applicable to the case where the two electrode pads are at the same height as in Modified Example shown in FIG. 7.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-055555, filed on Mar. 30, 2022, which is hereby incorporated by reference herein in its entirety.

What is claimed is:
1. A recording element unit for use in a liquid ejection head, comprising:
    a recording element substrate having an ejection energy generating portion, a flow passage, and an ejection port;
    an electric wiring member having a semiconductor integrated circuit for generating an electric signal for ejecting a liquid from the ejection port;

a first electrode pad provided at either one of the recording element substrate and the electric wiring member, and a second electrode pad provided on the other; and a wire connected at one end thereof with the first electrode pad at a first connection point, and connected at the other end thereof with the second electrode pad at a second connection point, the wire electrically connecting the first electrode pad and the second electrode pad, wherein the wire includes a plurality of bending points at which a direction of extension of the wire is bent between the first connection point and the second connection point, the plurality of bending points including at least a first bending point, a second bending point, and a third bending point in order of proximity to the first connection point, and wherein a height H1, a distance L2, and a distance W3 satisfy the following relational expressions (1), (2), and (3):

$$100 \ \mu m \leq H1 \leq 200 \ \mu m \quad (1)$$

$$100 \ \mu m \leq L2 \leq 270 \ \mu m \quad (2)$$

$$W3 \leq 150 \ \mu m \quad (3),$$

where H1 represents a height of the first bending point from the first connection point, L2 represents a distance from the first bending point to the second bending point in a horizontal direction, and W3 represents a distance from an intermediate point between the first electrode pad and the second electrode pad to the third bending point in the horizontal direction.

2. The recording element unit according to claim 1, wherein the wire:
   extends from the first connection point to the first bending point in a substantially vertical direction,
   extends from the first bending point to the second bending point so as to approach the second connection point in a substantially horizontal direction, and
   extends tilted downward from the second bending point to the second connection point through the third bending point, and an angle relative to the horizontal direction sharply changes at the third bending point.

3. The recording element unit according to claim 1, wherein the plurality of bending points are formed in the wire by a capillary operation.

4. The recording element unit according to claim 1, wherein a difference in height H0 and a horizontal distance L0 satisfy the following relational expression (4):

$$0 \leq H0/L0 \leq 1.3 \quad (4),$$

where H0 represents a difference in height between the first electrode pad and the second electrode pad, and L0 represents a horizontal distance from the first electrode pad to the second electrode pad.

5. The recording element unit according to claim 4, wherein the first electrode pad is provided at a higher position than that of the second electrode pad, and
wherein the difference in height H0 satisfies the following relational expression (5):

$$200 \ \mu m \leq H0 \leq 1000 \ \mu m \quad (5).$$

6. The recording element unit according to claim 5, wherein the horizontal distance L0 satisfies the following relational expression (6):

$$900 \ \mu m \leq L0 \leq 1500 \ \mu m \quad (6).$$

7. The recording element unit according to claim 1,
wherein the electric wiring member further has a heat-insulating member for supporting the semiconductor integrated circuit from thereunder,
wherein the first electrode pad is provided on the semiconductor integrated circuit, and
wherein the second electrode pad is provided on the recording element substrate.

8. The recording element unit according to claim 1, further comprising:
   a first pad array formed by arraying a plurality of first electrode pads at regular intervals in an array direction; and
   a second pad array formed by arraying a plurality of second electrode pads at the same intervals as those of the first electrode pads in the array direction.

9. The recording element unit according to claim 8,
wherein the first pad array comprises the first electrode pads arranged in two arrays so as to be alternate in the array direction,
wherein the second pad array comprises the second electrode pads arranged in two arrays so as to be alternate in the array direction, and
wherein the height H1 of the wires connected to the first electrode pads of one of the arrays of the first electrode pads arranged in two arrays is different from the height H1 of the wires connected to the first electrode pads of the other array.

10. The recording element unit according to claim 8,
wherein a pitch in the array direction of the first electrode pads of the first pad array is 80 μm or less.

11. The recording element unit according to claim 8,
wherein the width in the array direction of each of the first electrode pads and the second electrode pads is 60 μm or less.

12. The recording element unit according to claim 8,
wherein a pitch of the wires adjacent in the array direction is 80 μm or less.

13. A method for manufacturing a recording element unit for use in a liquid ejection head, the recording element unit comprising:
   a recording element substrate having an ejection energy generating portion, a flow passage, and an ejection port;
   an electric wiring member having a semiconductor integrated circuit for generating an electric signal for ejecting a liquid from the ejection port;
   a first electrode pad provided at either one of the recording element substrate and the electric wiring member, and a second electrode pad provided on the other; and
   a wire having a plurality of bending points, and connected at one end thereof with a first connection point of the first electrode pad, and connected at the other end thereof with a second connection point of the second electrode pad, the wire electrically connecting the first electrode pad and the second electrode pad, and
   wherein the wire includes, in order of proximity to the first connection point in a direction of extension of the wire, a first bending point at a height from the first connection point of at least 100 μm and not more than 200 μm, a second bending point at a horizontal distance from the first bending point of at least 100 μm and not more than 270 μm, and a third bending point provided at a lower position than that of the first bending point, and at a distance of within 150 μm from an intermediate point between the first electrode pad and the second electrode pad in a horizontal direction, the method for manufacturing a recording element unit comprising the steps of:

connecting one end of the wire to the first connection point;

sequentially forming the first bending point, the second bending point, and the third bending point of the wire by a capillary operation including four upward movements and three downward and horizontal movements of a capillary from the first connection point; and connecting the other end of the wire to the second connection point.

* * * * *